(12) United States Patent
Forrest et al.

(10) Patent No.: US 11,087,974 B2
(45) Date of Patent: Aug. 10, 2021

(54) PREPARATION OF COMPOUND SEMICONDUCTOR SUBSTRATE FOR EPITAXIAL GROWTH VIA NON-DESTRUCTIVE EPITAXIAL LIFT-OFF

(71) Applicant: The Regents of The University of Michigan, Ann Arbor, MI (US)

(72) Inventors: Stephen R. Forrest, Ann Arbor, MI (US); Kyusang Lee, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 13 days.

(21) Appl. No.: 16/595,552

(22) Filed: Oct. 8, 2019

(65) Prior Publication Data

US 2020/0111667 A1    Apr. 9, 2020

Related U.S. Application Data

(60) Provisional application No. 62/742,479, filed on Oct. 8, 2018.

(51) Int. Cl.
*H01L 21/02* (2006.01)
*H01L 21/324* (2006.01)
(Continued)

(52) U.S. Cl.
CPC .. *H01L 21/02463* (2013.01); *H01L 21/02389* (2013.01); *H01L 21/02392* (2013.01); *H01L 21/02395* (2013.01); *H01L 21/02461* (2013.01); *H01L 21/02505* (2013.01); *H01L 21/02543* (2013.01); *H01L 21/02546* (2013.01); *H01L 21/02664* (2013.01); *H01L 21/324* (2013.01);
(Continued)

(58) Field of Classification Search
CPC ........... H01L 21/02463; H01L 21/7813; H01L 21/02395; H01L 21/02389; H01L 21/02392; H01L 21/324; H01L 21/02461; H01L 21/02546; H01L 21/02543; H01L 21/02664; H01L 21/02505; H01L 21/67023; H01L 21/187; H01L 21/02002; H01L 21/6836; H01L 2224/80894; H01L 2224/82948; H01L 2224/8001; H01L 2221/68368
See application file for complete search history.

(56) References Cited

U.S. PATENT DOCUMENTS 5,244,818 A  *  9/1993  Jokerst ................... H01L 21/78
                                                       117/915
2011/0186910 A1 *  8/2011  Forrest ................ H01L 31/1852
                                                       257/190

(Continued)

*Primary Examiner* — Kyoung Lee
*Assistant Examiner* — Christina A Sylvia
(74) *Attorney, Agent, or Firm* — Harness, Dickey & Pierce, P.L.C.

(57) ABSTRACT

A method is presented for fabricating a substrate comprised of a compound semiconductor. The method includes: growing a sacrificial layer onto a parent substrate; growing an epitaxial template layer on the sacrificial layer; removing the template layer from the parent substrate using an epitaxial lift-off procedure; and bonding the removed template layer to a host substrate using Van der Waals forces and thereby forming a compound semiconductor substrate.

18 Claims, 3 Drawing Sheets

(51) Int. Cl.
*H01L 21/78* (2006.01)
*H01L 21/67* (2006.01)

(52) U.S. Cl.
CPC .... *H01L 21/7813* (2013.01); *H01L 21/67023* (2013.01); *H01L 2224/8001* (2013.01); *H01L 2224/80894* (2013.01); *H01L 2224/82948* (2013.01)

(56) References Cited

U.S. PATENT DOCUMENTS

2016/0307924 A1* 10/2016 Forrest ................ H01L 33/0093
2018/0047627 A1* 2/2018 Forrest ................ H01L 31/1896
2018/0114803 A1 4/2018 Forrest et al.

* cited by examiner

PREPARATION OF COMPOUND SEMICONDUCTOR SUBSTRATE FOR EPITAXIAL GROWTH VIA NON-DESTRUCTIVE EPITAXIAL LIFT-OFF

CROSS-REFERENCE TO RELATED APPLICATIONS

This application claims the benefit of U.S. Provisional Application No. 62/742,479, filed on Oct. 8, 2018. The entire disclosure of the above application is incorporated herein by reference.

GOVERNMENT CLAUSE

This invention was made with government support under Grant Nos. W911NF-08-2-0004 and W911NF-13-1-0485 awarded by the U.S. Army Research Laboratory's Army Research Office. The government has certain rights in the invention.

FIELD

The present disclosure relates to a technique for fabricating a compound semiconductor substrate.

BACKGROUND

Compound semiconductors provide many benefits over elemental semiconductors for numerous applications such as lasers, LEDs, solar cells, photodiodes, high frequency low power electronics, high temperature electronics, etc.; however, these applications are mainly limited by the cost and quality of the starting substrates. Even for GaAs and InP which are produced by relatively mature bulk crystal growth technologies, the wafer cost is much higher than for silicon substrates. Therefore, their applications are limited to only a few special uses. The best available commercial price for a 6" GaAs substrate is ~$150, approximately 100 times more expensive compared with the same volume of silicon wafers. Therefore, it is essential to overcome the device production cost barrier caused by expensive substrates to allow compound semiconductor devices to leverage their applications into mainstream commercial technology. This disclosure presents a method to create effective compound semiconductor substrates on which to grow normally expensive compound semiconductor devices. The process employs extremely low cost epitaxial growth on an arbitrary substrate starting with a thin film removed from its parent wafer by non-destructive epitaxial lift-off of the single crystalline epi-layer and bonding it onto a secondary host substrate via van der Waals bonding.

This section provides background information related to the present disclosure which is not necessarily prior art.

SUMMARY

This section provides a general summary of the disclosure, and is not a comprehensive disclosure of its full scope or all of its features.

A method is presented for fabricating a substrate comprised of a compound semiconductor. The method includes: growing a sacrificial layer onto a parent substrate; growing an epitaxial template layer on the sacrificial layer; removing the template layer from the parent substrate using an epitaxial lift-off procedure; and bonding the removed template layer to a host substrate using Van der Waals forces and thereby forming a compound semiconductor substrate. In most instances, the host substrate is comprised of a material that differs from the material comprising the parent substrate.

The compound semiconductor substrate is then used to fabricate a semiconductor device, for example by growing one or more layers onto the template layer of the compound semiconductor substrate.

In one embodiment, a first protection layer is grown onto a top surface of the parent substrate prior to growing the sacrificial layer onto the top surface of the parent substrate. Similarly, a second protective layer may be grown onto the template layer prior to removing the template layer from the parent substrate.

In some embodiments, the compound semiconductor substrate is annealed after bonding the removed template layer to a host substrate.

Before bonding the removed template layer to the top surface of the host substrate, oxides may be etched off a top surface of the host substrate.

To reuse the parent substrate, the process can be repeated. That is, the method may further include: growing a second sacrificial layer onto the parent substrate after template layer has been removed from the parent substrate; growing a second epitaxial template layer on the second sacrificial layer; removing the second template layer from the parent substrate using an epitaxial lift-off procedure; and bonding the removed second template layer to a second host substrate using Van der Waals forces.

After the template layer has been removed from the parent substrate, the first protection layer is preferably removed from the top surface of the parent substrate; and a second protection layer is grown onto the top surface of the parent substrate before growing the second sacrificial layer.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
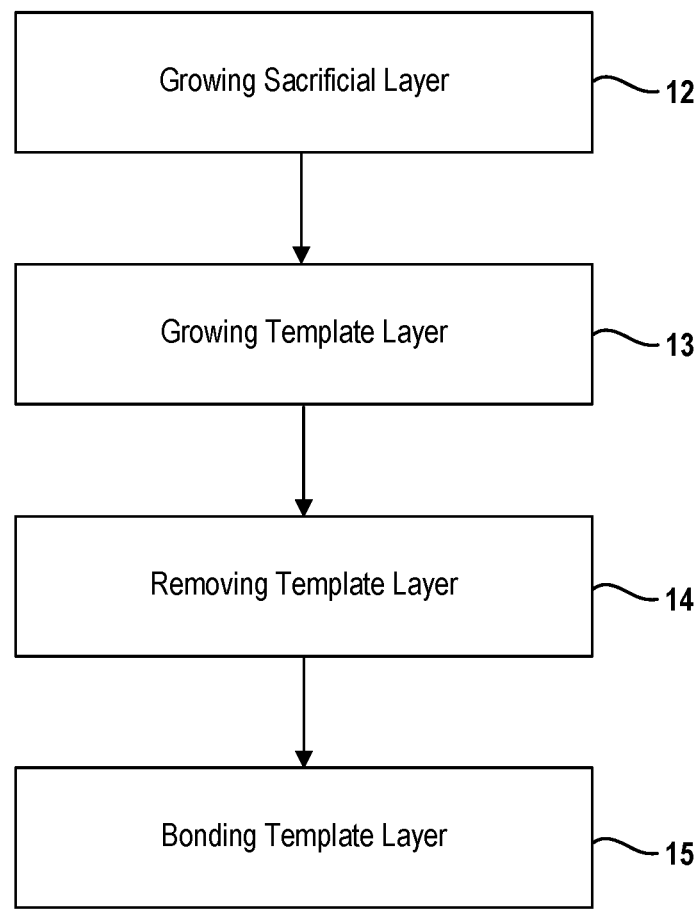
FIG. 1 is a flowchart depicting a method for fabricating a compound semiconductor substrate.

FIG. 1 depicts a method for fabricating a substrate having a compound semiconductor. Wafer recycling potentially enables the dramatic cost reduction for compound semiconductor device manufacturing by minimizing the expensive wafer cost. This disclosure presents a method to directly create multiple compound substrates for epitaxial growth on an arbitrary but smooth host substrate, instead of devices from a single substrate.

Figure 2A:
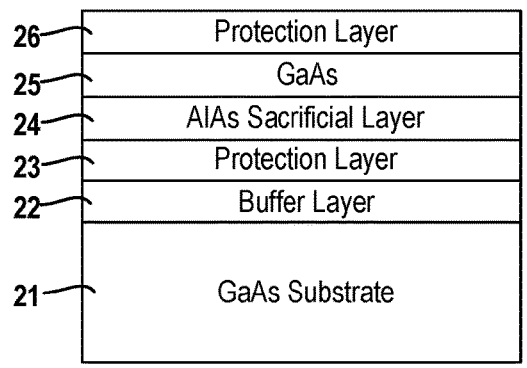
FIGS. 2A-2D are schematics illustrating the process flow for fabricating effective compound semiconductor substrates.

To begin fabrication, a sacrificial layer 24 is grown on a parent substrate 21 as indicated at 12. In an example embodiment, the sacrificial layer 24 is comprised of aluminum arsenide (AlAs) and the parent substrate 21 is comprised of gallium arsenide. Other suitable materials for the parent substrate include but are not limited to gallium nitride (GaN) and indium phosphide (InP). To enable recycling, buffer layers 22 and protection layers 23 are grown onto a top surface of the parent substrate 21 before the growth of the sacrificial layer 24 as seen in FIG. 2A. Example materials for the buffer layers 22 and protection layers 23 include but is not limited to indium phosphide or indium gallium arsenide (InGaAs). These materials are merely illustrative. Materials for the buffer layers 22 and the protection layers 23 are chosen to be chemical distinct from the sacrificial layer for etching purposes. Thus, it is readily understood that other types of materials may be used to grow these different layers.

After the growth of the sacrificial layer 24, an epitaxial template layer 25 is grown as indicated at 13 of FIG. 1. In the case of a GaAs parent substrate 21, the template layer 25 can be gallium arsenide, strained or un-strained InGaP, AlInGaP, AlInP or other comparable compounds. In the case of InP parent substrate, the template layer 25 can be InP, strained or un-strained InGaAs, InAlAs or other comparable compounds. Various protection layer schemes for InP can be employed including single, double protection layers consist of lattice matched or lattice mismatched InGaAs, InAlAs, etc. In either case, effective epitaxial substrate with various lattice constant can be prepared via strain relaxation as described by Leite et. al, in "Wafer-scale strain engineering of ultrathin semiconductor crystalline layers" *Adv. Mater.* 23, 3801-7 (2011). Moreover, a graded composition layer also can be employed to create the high quality templates 25 with various lattice constants as long as the template layer thickness is less than the critical thickness to create dislocations as approximated by the theory of Matthews and Blakeslee.

Figure 2B:
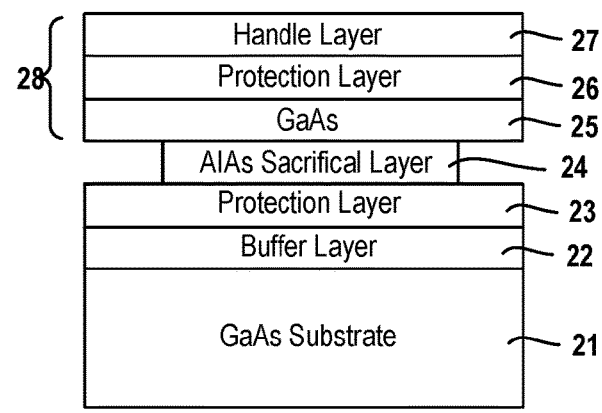

To preserve the surface quality of the template, a second protective layer 26 is grown onto the exposed surface of the template layer 25. For example, single or double protection layers consisting of lattice matched or lattice mismatched compounds, such as InGaP, AlInGaP, or AlInP, can be employed. To assist with epitaxial lift-off, a handle 27 may optionally be attached to the second protective layer 26 as seen in FIG. 2B. The handle 27 may take the form of black wax, thermal release tape or a polyimide coating. Again, these materials are merely illustrative. It is readily understood that other types of materials may be used to for these different layers.

Next, a template 28 is removed at 14 from the parent substrate using a non-destructive epitaxial lift-off process. More specifically, the template 28 is removed by selectively etching the sacrificial layer 24. In the example embodiment, template 28 is comprised of the handle layer 27, the second protective layer 26 and the template layer 25. Further information regarding the epitaxial lift-off process can be found in articles by Lee et al entitled "Reuse of GaAs substrates for epitaxial lift-off by employing protection layers" *J. Appl. Phys.* 111, 033527 (2012) and Lee et al entitled "Multiple growths of epitaxial lift-off solar cells from a single InP substrate" *Appl. Phys. Lett.* 97, 101107 (2010), which are incorporated herein by reference. Other techniques for removing the template also fall within the broader aspects of this disclosure.

Figure 2C:
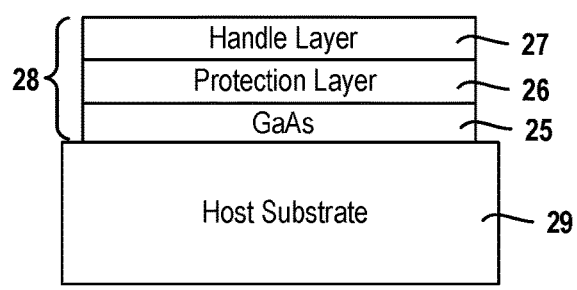

With continued reference to FIG. 1, the removed template 28 is bonded at 15 to a host substrate 29, thereby forming a compound semiconductor substrate. In the example embodiment, the removed template 28 is bonded to the host substrate 29 using Van der Waals forces as seen in FIG. 2C. Pressure may be applied uniformly across the removed template layer to help form the bond. Bonding between the thin-film template and substrate can be enhanced by annealing the sample at elevated temperatures ranging from 100° C. to 600° C., depending on the composition of the template, but not so high as to cause material degradation. Additionally or alternatively, oxides are etched off the top surface of the host substrate 26 before bonding the removed template 28 the top surface of the host substrate 29.

In an example embodiment, the host substrate 29 is comprised of a semiconductor material that differs from the semiconductor material comprising the parent substrate 21. For example, the host substrate 29 may be comprised of silicon or similar materials. In other examples, host substrate 29 is comprised of quartz, sapphire or another non-semiconductor material. In some embodiments, the host substrate 29 and the parent substrate 21 are comprised of the same material.

Figure 2D:
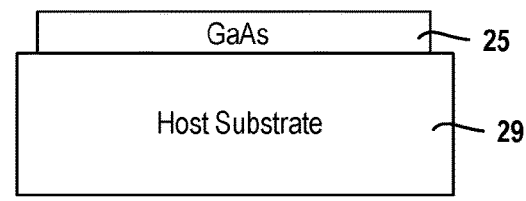
Figure 3A:
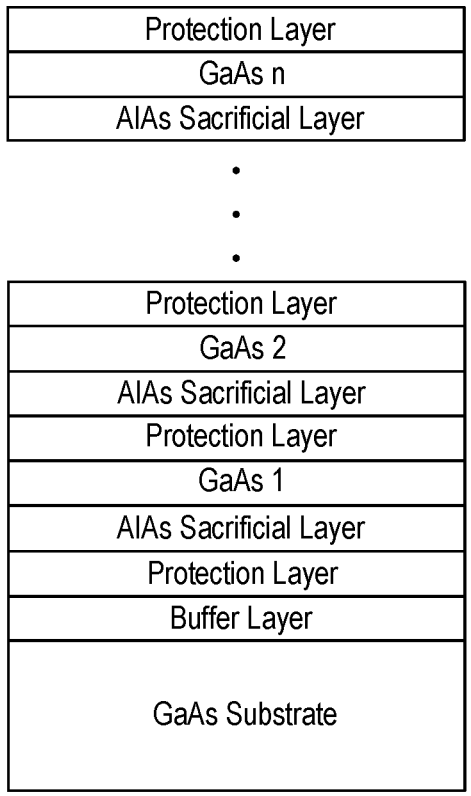
FIGS. 3A-3D are schematics illustrating the process flow for fabricating effective compound semiconductor substrates with multiple release layers.
Figure 3B:
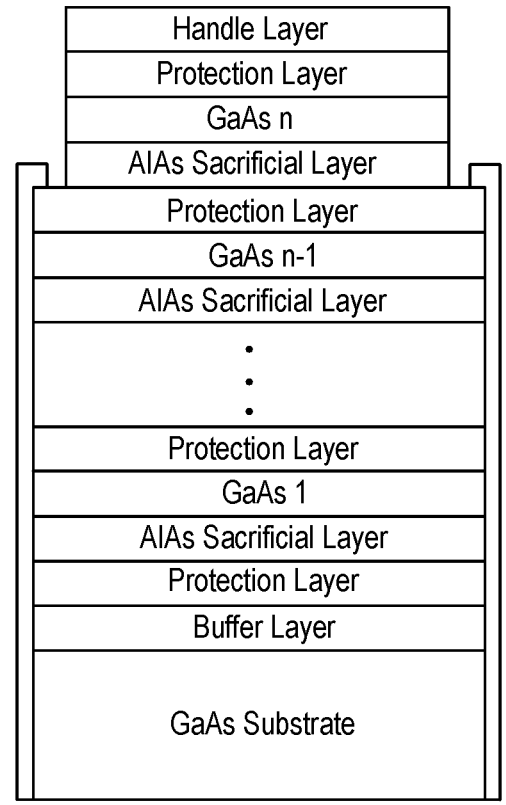
Figure 3C:
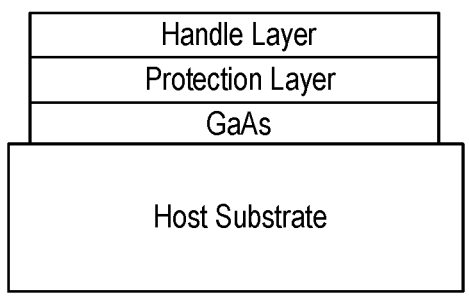
Figure 3D:
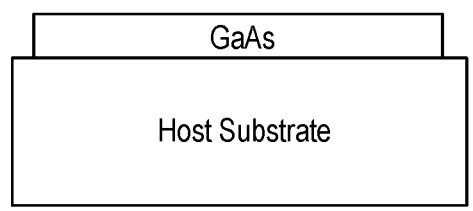

After the bonding process, the handle layer 27 is removed, for example by heating or by wet etching or by plasma etching. The epi-ready exposed surface of the template layer 25 is prepared by removing the second protection layer 26, for example using a selective wet etching process as seen in FIG. 2D. The exposed surface of the template layer 25 now serves as an epitaxial template for further growth of materials within that particular materials system.

Additionally, it is also noted that the first protection layer 23 and the buffer layer 22 can be removed from the parent substrate 21 to enable multiple effective compound semiconductor substrates from a single substrate. That is, the process of growing the template layer on and removing the template layer from the same parent substrate can be repeated. In this way, the more expensive parent substrate is reused and the cost of fabricating semiconductor devices is reduced.

Referring to FIG. 3A-3D, multiple release layer structures can be combined to create many effective compound substrates from a single parent wafer. Multiple stacked structures enable the creation of multiple template films from a single parent substrate. Moreover, the combination of multiple stacked structure and wafer recycling significantly enhances the productivity of templates from a single substrate. This process additionally requires patterning and sidewall passivation process used in single layer epitaxial lift-off (EFO) to selectively lift-off the films sequentially. Otherwise, the other procedures and material combinations are substantially the same as the process described above in relation to FIGS. 2A-2D.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for fabricating a substrate comprised of a compound semiconductor, comprising:
    growing a sacrificial layer onto a parent substrate;
    growing an epitaxial template layer on the sacrificial layer;
    removing the epitaxial template layer from the parent substrate using an epitaxial lift-off procedure; and
    bonding the removed template layer to a host substrate using Van der Waals forces and thereby forming a compound semiconductor substrate, where the host substrate is comprised of a material that differs from the material comprising the parent substrate.

2. The method of claim 1 further comprises growing a first protection layer onto a top surface of the parent substrate prior to growing the sacrificial layer onto the top surface of the parent substrate.

3. The method of claim 2 further comprises growing a second protective layer onto the template layer prior to removing the template layer from the parent substrate.

4. The method of claim 1 further comprises removing the template layer from the parent substrate by selectively etching the sacrificial layer.

5. The method of claim 1 further comprises annealing the compound semiconductor substrate after bonding the removed template layer to a host substrate.

6. The method of claim 1 further comprises etching oxides off a top surface of the host substrate before bonding the removed template layer to the top surface of the host substrate.

7. The method of claim 1 further comprises growing another layer onto the template layer of the compound semiconductor substrate.

8. The method of claim 1 further comprises
    growing a second sacrificial layer onto the parent substrate after template layer has been removed from the parent substrate;
    growing a second epitaxial template layer on the second sacrificial layer;
    removing the second template layer from the parent substrate using an epitaxial lift-off procedure; and
    bonding the removed second template layer to a second host substrate using Van der Waals forces.

9. A method for fabricating a substrate comprised of a compound semiconductor, comprising:
    growing a first protection layer onto a top surface of a parent substrate;
    growing a sacrificial layer onto an exposed surface of the first protection layer;
    growing an epitaxial template layer on an exposed surface of the sacrificial layer;
    removing the epitaxial template layer from the parent substrate using an epitaxial lift-off procedure; and
    bonding the removed epitaxial template layer to a host substrate using Van der Waals forces and thereby forming a compound semiconductor substrate.

10. The method of claim 9 further comprises removing the template layer from the parent substrate by selectively etching the sacrificial layer.

11. The method of claim 9 further comprises growing a second protective layer onto the template layer prior to removing the template layer from the parent substrate.

12. The method of claim 11 further comprises annealing the compound semiconductor substrate after bonding the removed template layer to a host substrate.

13. The method of claim 12 further comprises etching oxides off a top surface of the host substrate before bonding the removed template layer to the top surface of the host substrate.

14. The method of claim 13 further comprises growing another layer onto the template layer of the compound semiconductor substrate.

15. The method of claim 9 further comprises
growing a second sacrificial layer onto the parent substrate after template layer has been removed from the parent substrate;
growing a second epitaxial template layer on the second sacrificial layer;
removing the second template layer from the parent substrate using an epitaxial lift-off procedure; and
bonding the removed second template layer to a second host substrate using Van der Waals forces.

16. The method of claim 15 further comprises
removing the first protection layer from the top surface of the parent substrate after template layer has been removed from the parent substrate; and
growing a second protection layer onto the top surface of the parent substrate before growing the second sacrificial layer.

17. The method of claim 9 where the host substrate is comprised of a semiconductor material that differs from the semiconductor material comprising the parent substrate.

18. The method of claim 9 wherein the host substrate is further defined as one of quartz and sapphire.

* * * * *